United States Patent [19]

Wilhelm et al.

[11] Patent Number: 4,757,161
[45] Date of Patent: Jul. 12, 1988

[54] COMPOSITE SUPERCONDUCTING CONDUCTOR WITH SEVERAL CONDUCTOR STRANDS AND A METHOD FOR MANUFACTURING THE SAME

[75] Inventors: Manfred Wilhelm, Nürnberg; Karl Wohlleben, Erlangen, both of Fed. Rep. of Germany

[73] Assignee: Siemens Aktiengesellschaft, Berlin & Munich, Fed. Rep. of Germany

[21] Appl. No.: 924,682

[22] Filed: Oct. 28, 1986

[30] Foreign Application Priority Data

Nov. 12, 1985 [DE] Fed. Rep. of Germany ....... 3540070

[51] Int. Cl.$^4$ ...................... H01B 12/00; H01L 39/24
[52] U.S. Cl. .................................. 174/126 S; 29/599; 174/128 S
[58] Field of Search ............... 174/126 S, 128 S, 15 S; 29/599

[56] References Cited

U.S. PATENT DOCUMENTS 3,778,895 12/1973 Nomura et al. ............. 174/126 S X
4,652,697 3/1987 Ando et al. ................. 174/126 S X

FOREIGN PATENT DOCUMENTS 2056779 2/1974 Fed. Rep. of Germany .
2339525 9/1982 Fed. Rep. of Germany .
3430159 3/1985 Fed. Rep. of Germany .
1584811 1/1970 France .

*Primary Examiner*—Morris H. Nimmo
*Attorney, Agent, or Firm*—Kenyon & Kenyon

[57] ABSTRACT

A composite superconductor comprises a matrix of an alloy which is normally conductive at operating temperatures with the alloy being copper and another alloying element. Several superconducting filaments are embedded in the matrix with these filaments being formed by a diffusion reaction between at least two elements. An aluminum jacket surrounds the matrix. A barrier layer formed from at least one intermetallic copper-aluminum compound is disposed between the aluminum jacket and the alloy matrix. The aluminum jacket may be formed by extrusion at an elevated temperature with the boundary layer between the aluminum jacket and the alloy matrix being concurrently formed by diffusion.

9 Claims, 1 Drawing Sheet

COMPOSITE SUPERCONDUCTING CONDUCTOR WITH SEVERAL CONDUCTOR STRANDS AND A METHOD FOR MANUFACTURING THE SAME

BACKGROUND OF THE INVENTION

The invention relates to a superconducting composite conductor with stabilizing material and several superconducting conductor strands which consist of an intermetallic compound developed in a diffusion reaction of at least two elements and are embedded in a normally-conducting matrix which is surrounded by an aluminum jacket and contains copper as the alloying component of at least one of the elements of the compound, where at least one alloying element of the matrix is separated by a barrier from the stabilizing material. Composite superconducting conductors are known, for instance, from "IEEE Transactions on Magnetics", Vol. MAG-19 No. 3, May 1983, pages 672 to 675. The invention further relates to a method for manufacturing such a composite superconducting conductor. Superconductors suited for technical applications always contain in addition to a superconducting material component a normally-conducting component of high conductivity for stabilizing the superconducting state. If a local temperature rise occurs in such a conductor, for instance, as a result of jumps in the flux, the current-carrying capacity of the superconductor is reduced in the region under discussion or disappears altogether indeed, but the current can be carried for a brief moment by the normally-conducting component, so that the superconductor has the opportunity to recover. This process is therefore also designated as a stabilization means against transient disturbances. With the stabilizing component an excessive temperature rise of a coil wound with such a superconductor and its possible destruction can therefore be prevented.

For stabilizing superconductors, high-conductivity copper (Cu) is generally used which, with a so-called external stabilization, surrounds the superconductor in the form of a jacket, or, in the case of a so-called internal stabilization, is arranged as at least one core in the center of the conductor. Besides copper, aluminum (Al) is gaining increasing importance as a normally-conducting component for the stabilization of superconductors.

The conductivity of aluminum as compared with that of copper is substantially higher at 4.2° K. in a space free of magnetic field and also decreases considerably less in a magnetic field with increasing flux density than the conductivity of Cu. Thus, at 4,2° K. resistivities of $2 \times 10^{-9}$ ohm-cm and $6 \times 10^{-10}$ ohm-cm, respectively, are measured on samples of soft-annealed Cu 99.997% and soft-annealed Al 99.995%. At 4.2° K. and with a magnetic flux density of 12 tesla, the resistivity of copper samples is about 26/times higher that of aluminum samples, but only 6/times higher than in the absence of a magnetic field.

Such composite superconducting conductors, the current-carrying component of which is a brittle, non-deformable intermetallic compound, can be produced particularly by a special method, the so-called bronze process. In the case of the intermetallic compound $Nb_3Sn$, prefabricated composite wires with the final dimensions of the desired conductor, consisting of niobium wires or filaments in a matrix of copper-tin bronze are annealed at a temperature of about 700° C. for a predetermined time. Tin dissolved in copper, where in general in the phase, reacts in a solid reaction with the niobium, forming the desired intermetallic compound $Nb_3Sn$. If such bronze conductors are stabilized, as customary, with copper, the bronze of the matrix and the copper of the stabilizing cross section must be separated by a special intermediate layer, for instance, of niobium or in particular, of tantatum. Such metals then act as a diffusion barrier (see, for instance, DE-OS No. 23 39 525) and prevent, during the annealing reaction to develop the desired super-conducting compound, the penetration of tin into the stabilizing copper and thereby resulting in a reduction of the latter's electric and thermal conductivity. Admixtures as small as 0.05% by weight of tin reduce the residual resistance ratio of copper from about 1,000 to a value of about 20. With electrically and therefore also thermally poorly conducting copper, however, a sufficient stabilizing effect on the superconducting state is not attainable.

Next to copper as the stabilizing material of such composite conductors, stabilization with aluminum is also known. For this purpose the aluminum can be soldered, after the reaction, on a twisted conductor by means of lead-tin solder (see, "IEEE Transactions on Magnetics", Vol. MAG-17, No. 5, September 1981, pages 2047 to 2050).

Composite conductors of bronze and niobium filaments with a central core of aluminum can also be fabricated, where this core is surrounded by a diffusion barrier of niobium (see, for instance, "IEEE Transactions on Magnetics", Vol. MAG-21, No. 2, March 1985, pages 157 to 160). With this conductor type, however, the annealing reaction must be carried out below the melting point of aluminum.

Another method for stabilizing a superconductor composite conductor with aluminum is found in the publication mentioned at the outset "IEEE Trans. Magn." Vol. MAG-19. According to this method, a preliminary conductor product is first fabricated by embedding a predetermined number of wires of the one element of the compound, especially niobium wires, in a matrix which contains the remaining element or elements of the compound in the form of an alloy and thus consists of a tin-bronze, for instance. In addition, this structure contains, particularly on its outside, also copper as the stabilizing material which is separated from the bronze material in a manner known per se by diffusion-retarding or -inhibitory barriers. After this structure is worked to the desired final form, the desired superconducting compound such as $Nb_3Sn$ is developed in a diffusion reaction by means of a heat treatment. The superconducting core is finally provided with an aluminum jacket by extrusion; a good metallurgical bond between the copper and the aluminum can be achieved in this manner.

With the superconducting composite conductors produced by this known method, the diffusion barriers thus require part of the normal-conducting cross section, so that in this conductor type the effective current density $J_{ov}$ is limited accordingly. Furthermore the cross section cannot be reduced arbitrarily since the niobium or tantalum tubes used as barrier material have a tendency to burst if their wall thickness is too small, as would occur with the usual high degrees of deformation of the raw conductors.

SUMMARY OF THE INVENTION

It is therefore an object of the present invention to develop a superconducting composite conductor of the type mentioned at the outset in such a way that it can be stabilized by aluminum in a technically simple and cost-saving manner, and at the same time an effective current density $J_{ov}$ as high as possible is assured.

According to the invention, this problem is solved by the provision that the barrier is formed by the common boundary layer or interface between the aluminum of the jacket and the copper of the matrix alloy, and consists of at least one intermetallic copper-aluminum compound. A boundary layer is understood here to be also a transition region consisting of several layer-like or laminate zones between the mentioned metals.

The invention starts out from the fact that after the diffusion reaction for developing the desired superconducting intermetallic compound, the one element of this compound, which was at first present in the form of an alloy in the matrix, is not consumed completely but is still present in the matrix even though in a small amount. It is the basis of the invention that the matrix material can be provided with an aluminum jacket directly without adversely affecting the stabilizing action to an appreciable degree. For, in the process step of jacketing the matrix with aluminum, which must be carried out at elevated temperature, several Cu-Al compounds are generally developed by a diffusion reaction at the boundary layer between the copper of the alloying matrix and the aluminum of the jacket, which act as a barrier for the element of the superconducting compound still present in the matrix. In the case of a tin bronze, the still present tin does not diffuse through this boundary layer and therefore does not penetrate the aluminum. The advantages achieved with the invention are in particular that specific diffusion barriers such as of niobium or tantalum can be dispensed with and also a separate external copper layer of the matrix is not necessary. The superconducting conductor according to the invention is therefore of simple design and can be produced at low cost accordingly.

It is particularly advantageous to produce the superconducting composite conductor according to the invention by forming a conductor core with superconducting conductor filaments embedded in the matrix by a so-called bronze process and providing this conductor core subsequently, by extrusion at elevated temperature, with the aluminum jacket, the boundary layer being produced concurrently.

BRIEF DESCRIPTION OF THE DRAWINGS

For a further explanation of the invention, reference is made in the following to the drawings wherein like parts are identified by like reference numerals.

In the figures, like parts are provided with the same reference symbols.

DETAILED DESCRIPTION OF THE INVENTION

The embodiment examples indicated in the figures are based on producing composite superconducting conductors, and superconducting material of which is a superconducting intermetallic compound of the type $A_3B$ consisting of two components with at least one element each, which compound has an A15 crystal structure. The compound $Nb_3Sn$ will be assumed to be the material, although other binary or tertiary compounds can be produced similarly just as well. Since these compounds are generally very brittle, it is difficult to produce them in a form suitable, for instance, for magnet coils. For manufacturing them, the so-called bronze technique is therefore used (see, for instance, DE-OS No. 2,056,779; "Cryogenics", June 1976, pages 323 to 330 or "Kerntechnik", Vol. 20, 1978, No. 6, pages 253 to 261). This known method serves particularly for manufacturing so-called multicore conductors with conductor filaments arranged in a normal-conducting matrix (i.e. a matrix which is normally conductive at operating temperature of the superconducting material) which have at least superficial layers of the compounds mentioned. For this purpose a ductile element, for instance, in wire form of the compound to be produced is first surrounded by means of a compound containing ductile material of the matrix in a predetermined amount of the other elements of the compound to be made in the form of an alloy. A multiplicity of such wires can also be embedded in the matrix. The structure so obtained in then subjected to a cross section-reducing process and cut into a predetermined number of sections. These sections are then bundled and again elongated by reducing their cross section. By the reductions of the cross section, the diameter of the wire cores is reduced to a small value in the order of several millimeters. Thus, a not yet fully reacted preliminary product of the superconducting composite conductor is obtained in the proposed form of a long wire such as required for winding coils. This preliminary product is finally subjected to an annealing treatment in a vacuum or the atmosphere of an inert gas such as argon, where the element or elements contained in the matrix, of the superconducting alloy to be formed, diffuse into the material of the wire cores consisting of the other element of the compound and thus react with the latter, forming a layer consisting of the desired superconducting compound.

Figure 1:
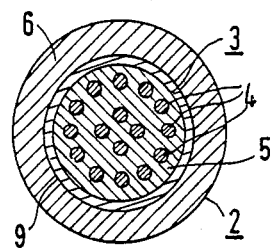
FIGS. 1 and 2 show schematically a cross section through the structure of a composite superconducting conductor according to the invention.

According to the embodiment example of a composite conductor 2 shown in FIG. 1, a conductor core 3 with circular cross section is thus obtained which contains a multiplicity of superconducting conductors or filaments 4 which are embedded in the matrix 5. The conductor filaments 4 consists here, at least at their surface, of the intermetallic compound $Nb_3Sn$. The matrix, for which initially an α-bronze with a maximum tin content of about 14.5% by weight is used as a lease for ductility reasons, still has left a residue of tin of several percent by weight even after the annealing treatment for forming the superconducting intermetallic compound. It consists therefore of a bronze as before with a substantially reduced tin content of, for instance, 3% by weight. According to the invention it is particularly easy and also cost-saving to stabilize this bronze matrix 5 with the embedded $Nb_3Sn$ conductors 4 with aluminum while preserving an effective current density $J_{ov}$ as large as possible. To this end, the conductor core 3 which is advantageously present in a monolithic form (i.e., a single conductor core 3 is within jacket 6 as illustrated, e.g., in FIG. 1), is jacketed in a manner known per se by extrusion with aluminum after the annealing reaction at a temperature between about 400° and 550° C. and preferably between 450° and 500° C. which is optimum for the current-carrying capacity. In the process, also the desired final profile of the composite conductor is formed.

Figure 2:
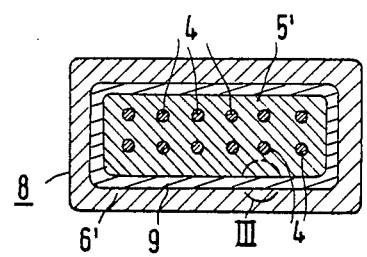

Deviating from the presentation according to FIG. 1, this final profile may also be, for instance, rectangular. A corresponding cross section of such a rectangular conductor 8 is indicated in FIG. 2. In this figure the deformed matrix is designated by 5' and the deformed aluminum jacket by 6'. Between these parts, the boundary layer 9 is formed which acts as a barrier between the aluminum and the tin found in the bronze of the matrix 5. A portion of this boundary layer 9 is shown magnified in FIG. 3.

The structure of the boundary layer 9 shown in this figure between the bronze matrix 5' and the aluminum jacket 6' can be detected by specific diffusion tests. It has been found that the large residual resistivity ratio of pure aluminum is not reduced practically if aluminum, pressed on bronze $CuSn^3$ is annealed for no longer than 0.5 hour at 500° C. A decrease of the aluminum conductivity in the extrusion process which occurs substantially faster is therefore not expected. A bronze with 3% by weight tin ($CuSn^3$) is assumed here since this concentration occurs frequently in the matrix bronze of reaction-annealed $Nb_3Sn$ conductors. Macroscopic examination and x-ray microanalyses of corresponding diffusion samples show that layers or zones, of few micrometers thick, of various intermetallic Cu-Al compounds are formed at the phase boundaries $CuSn^3/Al$ with short annealing times. According to FIG. 3, the boundary layer 9 between the matrix 5' and the jacket 6' formed after an anneal of one-ahlf hour at 500° C. is composed of three layer-like or laminal zones 9a, 9b, 9c with the respective thicknesses da, db and dc. The zone 9a with a thickness da of about 1 micrometer adjoining the matrix 5' consists here of an δ-phase (delta phase) of the system Cu-Al, while the material of the intermediate zone of about the same thickness, 9b, represents a η-phase (eta phase) of this system. For the zone 9c with a thickness dc of about 1.5 micrometers adjoining the Al jacket 6', a υ-phase (upsilon phase) of the mentioned system Cu-Al can be determined. The phase designations are chosen here in compliance with the teachings of M. Hansen and K. Anderko in "Constitution of Binary Alloys", McGraw Hill Book Company, New York 1958. Because of this formation of the layer-like zones 9a to 9c, a good bond between the material of the matrix 5' containing the superconducting conductor filaments 4 and the stabilizing aluminum jacket 6' is assured. Furthermore, it is clear that a transport of matter takes place exclusively by migration of the copper atoms. Accordingly, no aluminum is found in the bronze of the matrix 5' and conversely, no tin is found in the aluminum of the jacket 6'.

On the basis of this metallurgical process $Nb_3Sn$ superconductors which are pre-reacted by means of the described extrusion process and which consist only of a bronze matrix and embedded $Nb_3Sn$ conductor filaments can be stabilized by aluminum without the incorporation of additional diffusion barriers. The amount of nonsuperconducting material in the conductor cross section is thereby minimized, differing from stabilization by Cu clad with Ta tantalum. Thus, correspondingly higher values for the effective current density $J_{ov}$ are obtained.

Figure 3:
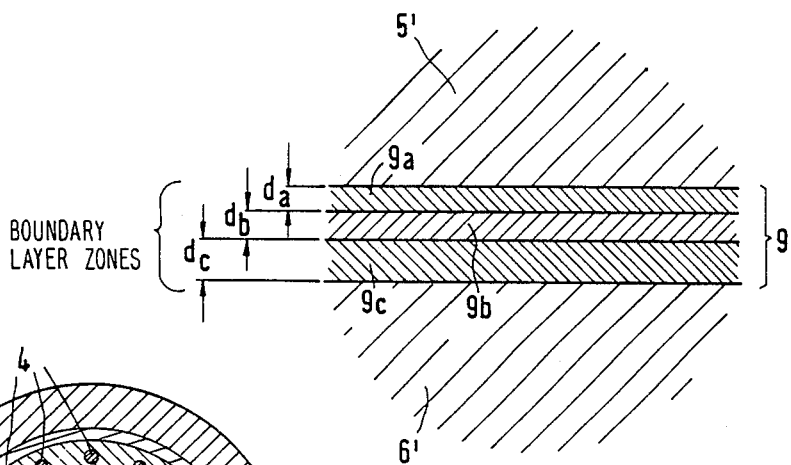
FIG. 3 shows a detail of the composite conductor according to FIG. 2.
Figure 4:
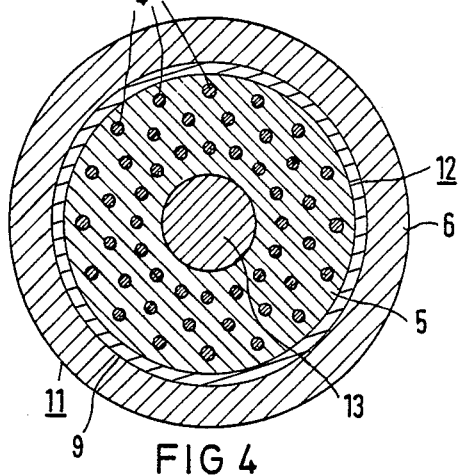
FIG. 4 shows schematically a further embodiment of a composite conductor according to the invention.

In the manufacture of the composite conductors 2 and 8 shown in FIGS. 1 to 3, a matrix was assumed which has an at least largely homogenous composition of its bronze. It is particularly advantageous, however, if individual regions 13 with greater tin content are additionally provided in this matrix in order to reduce tin diffusion paths during the annealing reaction for developing the desired superconducting compound. Such an embodiment example is the basis of the composite conductor which is indicated in FIG. 4 and designated with 11. This composite conductor corresponds largely to the conductor 2 shown in FIG. 1 and thus has a circular cross section, although it could have just as well the profile shown in FIG. 2. Its central conductor core 12 is provided with an aluminum jacket 6 after diffusion annealing. In this core, a region 13 is formed, however, which came from a subarea of the bronze matrix which was filled with tin (Sn) before the annealing reaction and with which several percent by weight (generally up to about 10% by weight) copper (Cu) can be alloyed. Since not all the Sn is used up during the annealing treatment a certain excess of Sn is still present in the region 13 shown. Instead of the one region with an excess of Sn, also several Sn(Cu) regions uniformly distributed over the cross section of the conductor core can advantageously be provided.

In addition, conductor corres of composite conductors can, of course, be surrounded with aluminum, differing from the embodiment examples shown in the figures, in the bronze matrix of which regions of Cu surrounded by special diffusion barriers are arranged, in addition to the superconducting conductor filaments. The type and design of the diffusion layers 9a to 9c between the outer Al jacket 6 or 6' and the adjoining material of the bronze matrix 5 or 5' do not change, since the tin does not participate in the reaction process at the boundary region between these materials. This can also be seen from the fact that in diffusion samples which are annealed for several hours at 500° C., even a considerable rise of the tin concentration is observed which is a consequence of the Cu migration into the Al.

What is claimed is:

1. A superconducting composite conductor comprising:
   (a) a matrix of an alloy which is normally conductive at operating temperatures, said alloy consisting of copper and another alloying element;
   (b) several superconducting filaments embedded in the matrix which consist of an intermetallic compound formed in a diffusion reaction between at least two elements;
   (c) an aluminum jacket surrounding the matrix; and
   (d) a barrier separating said jacket and matrix, said barrier consisting of a common boundary layer between the aluminum contained in the jacket and the copper contained in the matrix, said layer consisting of at least one intermetallic copper-aluminum compound.

2. The composite conductor of claim 1 wherein at least one element of said at least two elements of the intermetallic compound is said another alloying element of the alloy of the matrix.

3. A method for manufacturing a superconducting composite conductor comprising:
   providing a conductor core comprised of an alloy matrix which is normally conductive at operating temperatures, said alloy matrix being copper and another alloying element, said alloy matrix having disposed therein several filaments comprised of at least one element of a superconducting material;

annealing said core causing said another alloying element to diffuse into said filaments thereby rendering said filaments superconducting;

providing said core with an aluminum jacket by extrusion at an elevated temperature; and concurrently with said extrusion at elevated temperature, forming by diffusion a boundary layer of at least one intermetallic copper-aluminum compound between said aluminum jacket and said alloy matrix.

4. A method according to claim 3 wherein said conductor core is provided with at least one region having an increased content of said another alloying element.

5. A method according to claim 3 wherein said superconducting filaments formed by said diffusion are an intermetallic $Nb_3Sn$ compound and said matrix is initially a $\alpha$-bronze with a tin content of no more than about 14.5% by weight.

6. A method according to claim 4 wherein said at least one region comprises bronze with tin alloyed with up to about 10% copper by weight.

7. A method according to claim 3 wherein said extrusion is performed at a temperature in the range of 400° C. to 550° C.

8. A method according to claim 3 wherein said extrusion is performed at a temperature in the range of between 450° C. to 500° C.

9. A method according to claim 3 wherein said conductor core has a monolithic structure.

* * * * *